(12) United States Patent
Jung

(10) Patent No.: US 12,496,670 B2
(45) Date of Patent: Dec. 16, 2025

(54) APPARATUS FOR COOLING AND LOAD-COMPENSATING RAM SPINDLE AND MACHINE TOOL INCLUDING SAME

(71) Applicant: DN SOLUTIONS CO., LTD., Changwon (KR)

(72) Inventor: Youngkun Jung, Changwon (KR)

(73) Assignee: DN SOLUTIONS CO., LTD., Changwon (KR)

( * ) Notice: Subject to any disclaimer, the term of this patent is extended or adjusted under 35 U.S.C. 154(b) by 132 days.

(21) Appl. No.: 18/554,810

(22) PCT Filed: Apr. 15, 2022

(86) PCT No.: PCT/KR2022/005482
§ 371 (c)(1),
(2) Date: Oct. 11, 2023

(87) PCT Pub. No.: WO2022/220646
PCT Pub. Date: Oct. 20, 2022

(65) Prior Publication Data
US 2024/0198470 A1   Jun. 20, 2024

(30) Foreign Application Priority Data

Apr. 15, 2021 (KR) .......... 10-2021-0049006

(51) Int. Cl.
| B23Q 11/14 | (2006.01) |
| B23Q 11/00 | (2006.01) |
| H05K 7/20 | (2006.01) |

(52) U.S. Cl.
CPC ........ *B23Q 11/141* (2013.01); *B23Q 11/0017* (2013.01); *B23Q 2717/00* (2013.01); *H05K 7/20263* (2013.01)

(58) Field of Classification Search
CPC .............. H05K 7/20263; B23Q 11/141; B23Q 11/0017; B23Q 2717/00
See application file for complete search history.

(56) References Cited

U.S. PATENT DOCUMENTS

| 6,089,797 A * | 7/2000 | Chen ................ F28F 27/00 165/206 |
| 2010/0183393 A1* | 7/2010 | Sato .................. B23Q 11/141 409/64 |
| 2024/0198470 A1* | 6/2024 | Jung .................. B23Q 1/012 |

FOREIGN PATENT DOCUMENTS

| CN | 203993075 U * | 12/2014 |
| CN | 106736799 A * | 5/2017 |

(Continued)

OTHER PUBLICATIONS

Translation of CN206393220U named Translation-CN206393220U (Year: 2017).*

(Continued)

*Primary Examiner* — Paul Alvare
(74) *Attorney, Agent, or Firm* — Harvest IP Law, LLP

(57) ABSTRACT

An apparatus for cooling a ram spindle and compensating for a load comprises a saddle installed to be transferred along a cross rail; a ram spindle installed to be transferred along the saddle; a transfer unit configured to transfer the ram spindle relative to the saddle by means of a box guideway; a cooling unit configured to cool the ram spindle; and a load compensation unit including gibs and configured to adjust a load applied from the ram spindle to the saddle, wherein the gibs are provided as a plurality of gibs provided inside the saddle, disposed between the saddle and the ram spindle, except for a reference surface with which the ram spindle is in close contact, and installed to correspond to the reference surface in a horizontal direction or a vertical direction.

11 Claims, 9 Drawing Sheets

(56) References Cited

FOREIGN PATENT DOCUMENTS

| | | | | |
|---|---|---|---|---|
| CN | 206393220 U | * | 8/2017 | |
| JP | 2000254834 A | * | 9/2000 | |
| JP | 2011121157 A | * | 6/2011 | ......... B23Q 11/0028 |

OTHER PUBLICATIONS

Translation of JP2011121157A named Translation-JP2011121157A (Year: 2011).*
Translation of CN203993075U named Translation-CN203993075U (Year: 2014).*
Translation of JP2000254834A named Translation-JP2000254834A (Year: 2000).*
Translation of CN106736799A named Translation-CN106736799A (Year: 2017).*

* cited by examiner

US 12,496,670 B2

APPARATUS FOR COOLING AND LOAD-COMPENSATING RAM SPINDLE AND MACHINE TOOL INCLUDING SAME

CROSS REFERENCE TO RELATED APPLICATION(S)

This application is a National Stage of International Application No. PCT/KR2022/005482 filed on Apr. 15, 2022, claiming priority based on Korean Patent Application No. 10-2021-0049006 filed on Apr. 15, 2021 the disclosure of which is incorporated herein by reference in their entirety.

FIELD OF THE DISCLOSURE

The present disclosure relates to an apparatus for cooling a ram spindle and compensating for a load and a machine tool including the same, and more particularly, to an apparatus for cooling a ram spindle and compensating for a load and a machine tool including the same, in which a cooling unit cools a friction part between a ram spindle and a saddle when the ram spindle, which is transferred by means of the box guideway, is thermally deformed, and a load applied to a gib is automatically compensated in case that the load applied to the gib is changed by the thermal deformation of the ram spindle, such that surface pressure applied to the gib is constantly and automatically maintained, thereby improving machining precision of the machine tool.

BACKGROUND OF THE DISCLOSURE

In general, a machine tool refers to a machine used to process metal/non-metal workpieces in a desired shape and dimension using a suitable tool by using various types of cutting or non-cutting methods.

Various types of machine tools including a turning center, a vertical/horizontal machining center, a door-type machining center, a Swiss turning machine, an electric discharge machine, a horizontal NC boring machine, a CNC lathe, and a multi-tasking machining center are being widely used to suit the purpose of the corresponding work in various industrial sites.

The multi-tasking machining center, among the machine tools, refers to a turning center equipped with a multifunctional automatic tool changer (ATC) and a tool magazine in order to perform various types of machining processes such as turning, drilling, tapping, or milling. In the case of the multi-tasking machining center, an operator manually mounts a tool on a tool magazine when loading the tool required for a machining process or changing the tools.

In general, various types of currently used machine tools each have a control panel to which a numerical control (NC) technology or a computerized numerical control (CNC) technology is applied. The control panel is provided with a multifunctional switch or button, and a monitor.

In addition, the machine tool includes a table on which a material, i.e., a workpiece is seated and which transfers the workpiece to machine the workpiece, a palette used to prepare the workpiece to be machined, a spindle coupled to a tool or the workpiece and configured to be rotated, and a tailstock and a steady rest configured to support the workpiece during the machining process.

In general, the machine tool is provided with a transfer unit configured to transfer the table, a tool post, the spindle, the tailstock, and the steady rest along a transfer shaft in order to perform various types of machining processes.

Further, the machine tool generally uses a plurality of tools in order to perform various types of machining processes, and a tool magazine or a turret is used in the form of a tool storage place for receiving and storing the plurality of tools.

The machine tool uses the plurality of tools in order to perform various types of machining processes, and the tool magazine is used in the form of a tool storage place for receiving and storing the plurality of tools.

In addition, the machine tool is generally equipped with the automatic tool changer (ATC) configured to withdraw a specific tool from the tool magazine or remount the tool on the tool magazine based on an instruction of a numerical control unit in order to improve productivity of the machine tool.

Further, the machine tool is generally equipped with an automatic palette changer (APC) in order to minimize the non-machining time. The automatic palette changer (APC) automatically changes the palettes between a workpiece machining region and a workpiece loading region. The workpiece may be mounted on the palette.

In general, a machining center refers to a machine tool that has the automatic tool changer and changes various types of tools to perform various types of machining that may be performed by lathes, milling machines, drilling machines, boring machines, and the like. The machining center is mainly classified into a horizontal machining center and a vertical machining center in which a spindle is vertically mounted.

In general, a double-column type machining center, which is one of the large-scale machine tools, refers to a device that directly performs machining on a three-dimensional shape while changing a plurality of head attachments, unlike a lathe that performs simple machining.

In the double-column type machining center, various head attachments may be detachably mounted at a lower end of a ram spindle to machine workpieces having various shapes in various spaces and at various angles.

As described above, the ram spindle of the machine tool in the related art is transferred relative to the saddle in a height direction by means of a box guideway.

In case that the ram spindle is transferred relative to the saddle by means of the box guideway, a large amount of heat is generated because a contact area is large and friction is high in comparison with a case using a linear motor guide. In particular, in the case of the use of the box guideway, a large amount of heat is generated from contact friction surfaces between an outer edge of the ram spindle and the saddle, and the ram spindle is displaced in the height direction (Z-axis direction) and a vertical direction (X-axis direction), which degrades machining precision of the machine tool.

That is, as illustrated in FIG. 1, when the saddle rectilinearly reciprocates in the horizontal direction (Y-axis direction) along a cross rail in the machine tool that transfers the ram spindle relative to the saddle by means of the box guideway, the deformation caused by thermal expansion resulting from heat generation causes deformation in the vertical direction (X-axis direction), which causes a problem in that machining precision deteriorates, a machining defect occurs, waste of a workpiece occurs, and machining costs are increased. Specifically, when the saddle repeatedly moves from 600 mm to 2,600 mm in the horizontal direction (Y-axis direction) along the cross rail by means of the box guideway, the thermal expansion resulting from heat generation causes deformation around at most 125 μm in the vertical direction (X-axis direction), which may degrade machining precision.

When the ram spindle is thermally deformed by heat generated from the contact friction surfaces between the ram spindle and the saddle in the machine tool in the related art that transfers the ram spindle by means of the box guideway, the thermal deformation is compensated by correcting position of a tool mounted at a tip of the ram spindle.

However, in the case of an apparatus for cooling a ram spindle and compensating for a load, which transfers the ram spindle by means of the box guideway, and a machine tool including the same in the related art, there is still a problem in that a correction defect occurs because of a change in ambient temperature or reliability of a sensor. Further, because a heat source itself cannot be controlled, there is a limitation in that only the thermal deformation caused by partial expansion resulting from frictional heat is corrected, which causes a problem of deterioration in machining precision and reliability of the machine tool.

In addition, the apparatus for cooling the ram spindle and compensating for a load, which transfers the ram spindle by means of the box guideway, and the machine tool including the same in the related art perform minus control in consideration of heat generated by a rotation of the spindle and seasons or surrounding environments. However, there is a problem in that condensation occurs because of the season or the surrounding environment, and a ram spindle motor is short-circuited or rusted, which causes damage to or breakage of the apparatus and increases a risk of the occurrence of a safety accident.

Moreover, in the case of the apparatus for cooling the ram spindle and compensating for a load, which transfers the ram spindle by means of the box guideway, and the machine tool including the same in the related art, various types of software or hardware are provided to cool the ram spindle thermally deformed by the transfer and operation of the ram spindle and to constantly maintain surface pressure applied by a load applied to a gib. For this reason, there is a problem in that the structure is complicated, manufacturing costs are increased, a large amount of time is required for installation, and the operator is inconvenienced.

Furthermore, in the case of the apparatus for cooling the ram spindle and compensating for a load, which transfers the ram spindle by means of the box guideway, and the machine tool including the same in the related art, the deterioration in machining precision degrades the stability and reliability of the machine tool, increases maintenance costs and time, and increases the non-machining time, which causes a problem of deterioration in productivity of the machine tool.

DISCLOSURE

Summary

The present disclosure has been made in an effort to solve the above-mentioned problem, and an object of the present disclosure is to provide an apparatus for cooling a ram spindle and compensating for a load and a machine tool including the same, in which a cooling unit cools a friction part between a ram spindle and a saddle when the ram spindle, which is transferred by means of the box guideway, is thermally deformed, and a hydraulic pressure closed circuit automatically compensates for a load applied to a plurality of gibs, which is provided inside the saddle and installed between the saddle and the ram spindle, except for a reference surface with which the ram spindle is in close contact, so as to correspond to the reference surface in a horizontal direction or a vertical direction in case that a load applied to the gib is changed by thermal deformation of the ram spindle even though the cooling unit is used, such that the surface pressure applied to the gib is automatically and constantly maintained, which makes it possible to improve machining precision of the machine tool, reduce machining costs by preventing a waste of resources, improve productivity by increasing a non-machining time, and improve stability and reliability of the machine tool.

In order to achieve the above-mentioned object, the present disclosure provides an apparatus for cooling a ram spindle and compensating for a load, the apparatus including: a saddle installed to be transferred along a cross rail; a ram spindle installed to be transferred along the saddle; a transfer unit configured to transfer the ram spindle relative to the saddle by means of a box guideway; a cooling unit configured to cool the ram spindle; and a load compensation unit including gibs and configured to adjust a load applied from the ram spindle to the saddle, in which the gibs are provided as a plurality of gibs provided inside the saddle, disposed between the saddle and the ram spindle, except for a reference surface with which the ram spindle is in close contact, and installed to correspond to the reference surface in a horizontal direction or a vertical direction.

In addition, in the embodiment of the apparatus for cooling the ram spindle and compensating for a load, the cooling unit may cool the ram spindle when the ram spindle of the apparatus for cooling the ram spindle and compensating for a load is thermally deformed, and the load compensation unit may automatically compensate for a load applied to the gib and constantly and automatically maintain surface pressure applied to the gib when the load applied to the gib is changed by the thermal deformation of the ram spindle.

In addition, in the embodiment of the apparatus for cooling the ram spindle and compensating for a load, the transfer unit of the apparatus for cooling the ram spindle and compensating for a load may include a driving unit configured to generate power for transferring the ram spindle, and the reference surface may be provided as a plurality of reference surfaces formed on a surface with which an inner part of the saddle adjacent to the driving unit and a part adjacent to an outer edge of the ram spindle are in close contact.

In addition, in the embodiment of the apparatus for cooling the ram spindle and compensating for a load, the gibs of the apparatus for cooling the ram spindle and compensating for a load may be installed to be inserted between the inner part of the saddle, which faces the reference surface, and the part adjacent to the outer edge of the ram spindle based on a diagonal line passing through edges of the ram spindle, which are not adjacent to one another, based on the plurality of reference surfaces.

In addition, in the embodiment of the apparatus for cooling the ram spindle and compensating for a load, the gib of the apparatus for cooling the ram spindle and compensating for a load may include: a main body portion having a horizontal portion having one side formed in parallel with a height direction, and a tapered portion having the other side tapered in the height direction and configured to come into contact with the saddle; a pocket portion recessed in a part of the tapered portion and configured to accommodate hydraulic pressure; and a sealing portion configured to prevent hydraulic pressure from leaking from the pocket portion.

In addition, in the embodiment of the apparatus for cooling the ram spindle and compensating for a load, the load compensation unit of the apparatus for cooling the ram spindle and compensating for a load may include: a hydraulic pressure flow path formed through a part of the saddle so that one side thereof communicates with the pocket portion; and a compensation part installed to communicate with the other side of the hydraulic pressure flow path and configured to restore hydraulic pressure in the pocket portion or supply hydraulic pressure to the pocket portion through the hydraulic pressure flow path depending on a load applied to the gib.

In addition, in the embodiment of the apparatus for cooling the ram spindle and compensating for a load, the compensation part of the apparatus for cooling the ram spindle and compensating for a load may include a storage portion expandably installed in the compensation part and configured to store hydraulic pressure.

In addition, in the embodiment of the apparatus for cooling the ram spindle and compensating for a load, the gib of the apparatus for cooling the ram spindle and compensating for a load may be provided as four gibs installed between upper and lower sides of the inner part of the saddle, which faces the reference surface, and the part adjacent to the outer edge of the ram spindle.

In addition, in the embodiment of the apparatus for cooling the ram spindle and compensating for a load, the cooling unit of the apparatus for cooling the ram spindle and compensating for a load may include: a plurality of cooling flow paths formed through a part of the ram spindle in a height direction or installed to be inserted into a part of the ram spindle to allow a cooling fluid to flow; and a coupling part disposed on a part of the ram spindle so as to communicate with the cooling flow path and configured to transmit the cooling fluid to the cooling flow path, restore the cooling fluid from the cooling flow path, or circulate the cooling fluid.

In addition, in the embodiment of the apparatus for cooling the ram spindle and compensating for a load, the plurality of cooling flow paths may be provided as four cooling flow paths disposed adjacent to an inner edge of the ram spindle adjacent to contact friction surfaces between the ram spindle and the saddle.

In addition, in the embodiment of the apparatus for cooling the ram spindle and compensating for a load, the cooling unit of the apparatus for cooling the ram spindle and compensating for a load may further include: a sensing part disposed on the ram spindle and configured to sense a temperature of the ram spindle; and a sealing part disposed in the coupling part and configured to prevent the cooling fluid from leaking from the cooling flow path.

In addition, in the embodiment of the apparatus for cooling the ram spindle and compensating for a load, the cooling unit of the apparatus for cooling the ram spindle and compensating for a load may further include support parts disposed at upper and lower sides of the cooling flow path and configured to support the cooling flow path.

In order to achieve the above-mentioned object, the present disclosure provides a machine tool including an apparatus for cooling a ram spindle and compensating for a load, the machine tool including: a bed; a pair of columns installed at two opposite sides of the bed and extending in a height direction; a cross rail installed to be transferred along the pair of columns; a saddle installed to be transferred along the cross rail; a ram spindle installed to be transferred along the saddle; and an apparatus for cooling the ram spindle and compensating for a load configured to cool the ram spindle and compensate for a load when the ram spindle is thermally expanded, in which the apparatus for cooling a ram spindle and compensating for a load includes: a transfer unit having a driving unit and configured to transfer the ram spindle relative to the saddle by means of a box guideway; a cooling unit configured to cool the ram spindle; and a load compensation unit including a plurality of gibs provided inside the saddle, disposed between the saddle and the ram spindle, except for a reference surface with which the ram spindle is in close contact, and installed to correspond to the reference surface in a horizontal direction or a vertical direction, the load compensation unit being configured to automatically compensate for a load applied from the ram spindle to the saddle, in which the cooling unit cools the ram spindle when the ram spindle is thermally deformed, and in which when a load applied to the gib is changed by the thermal deformation of the ram spindle, the load is automatically compensated so that surface pressure applied to the gib is constantly maintained.

In addition, in the embodiment of the machine tool including an apparatus for cooling a ram spindle and compensating for a load, the reference surface of the machine tool including an apparatus for cooling a ram spindle and compensating for a load may be provided as a plurality of reference surfaces with which an inner part of the saddle adjacent to the driving unit and a part adjacent to an outer edge of the ram spindle are in close contact, and the gibs may be provided as four gibs installed between upper and lower sides of the inner part of the saddle, which faces the reference surfaces, and the part adjacent to the outer edge of the ram spindle based on a diagonal line passing through edges of the ram spindle, which are not adjacent to one another, based on the plurality of reference surfaces.

According to the apparatus for cooling the ram spindle and compensating for a load and the machine tool including the same according to the present disclosure, the cooling unit cools the friction part between the ram spindle and the saddle when the ram spindle, which is transferred by means of the box guideway, is thermally deformed. In case that a load applied to the gib is changed by thermal deformation of the ram spindle even though the cooling unit is used, a hydraulic pressure closed circuit automatically compensates for the load applied to the plurality of gibs, which is provided inside the saddle and installed between the saddle and the ram spindle, except for the reference surface with which the ram spindle is in close contact, so as to correspond to the reference surface in the horizontal direction or the vertical direction, such that the surface pressure applied to the gib is automatically and constantly maintained. Therefore, it is possible to maximize the machining precision of the machine tool and improve the stability and reliability of the machine tool.

In addition, according to the apparatus for cooling the ram spindle and compensating for a load and the machine tool including the same according to the present disclosure, it is possible to prevent damage to or breakage of the apparatus and a safety accident caused by the occurrence of a short circuit or rust by simply and quickly detecting the deterioration in machining precision caused by the thermal deformation of the ram spindle, and achieve the convenience for the operator.

Furthermore, the apparatus for cooling the ram spindle and compensating for a load and the machine tool including the same according to the present disclosure may reduce costs and time required to machine and maintain the workpiece and improve the productivity of the machine tool by reducing the non-machining time.

Further, the apparatus for cooling the ram spindle and compensating for a load and the machine tool including the same according to the present disclosure may reduce installation and manufacturing costs by miniaturizing the apparatus for cooling the ram spindle and compensating for a load, and make the machine tool compact.

DETAILED DESCRIPTION OF CERTAIN INVENTIVE EMBODIMENT

Figure 1:
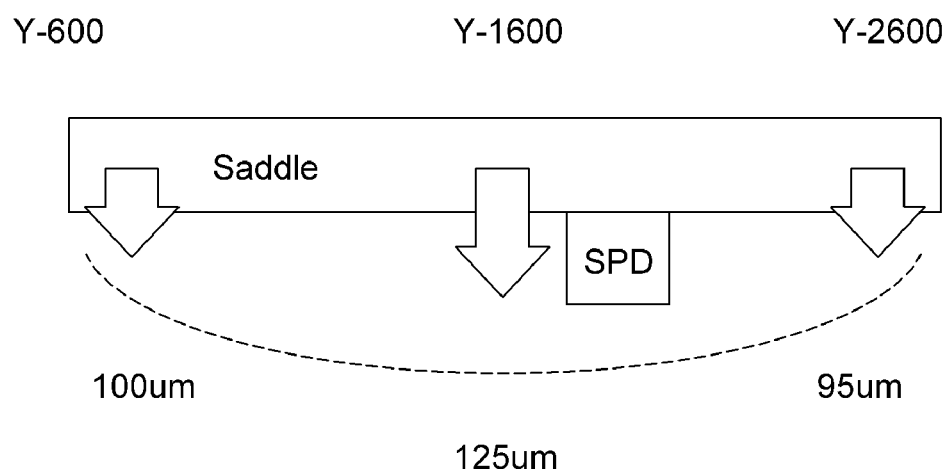
FIG. 1 is a graph illustrating the occurrence of displacement caused by thermal deformation in the machine tool that transfers a ram spindle relative to a saddle by means of a box guideway in the related art.

Hereinafter, an apparatus for operating a main shaft of a machine tool according to an exemplary embodiment of the present disclosure will be described in detail with respect to the drawings. The following exemplary embodiments are provided as examples for fully transferring the spirit of the present disclosure to those skilled in the art. Therefore, the present disclosure is not limited to the exemplary embodiments described below and may be specified as other aspects. Further, in the drawings, a size and a thickness of the apparatus may be exaggerated for convenience. Like reference numerals indicate like constituent elements throughout the specification.

Advantages and features of the present disclosure and methods of achieving the advantages and features will be clear with reference to exemplary embodiments described in detail below together with the accompanying drawings. However, the present disclosure is not limited to the exemplary embodiments disclosed herein but will be implemented in various forms. The exemplary embodiments of the present disclosure are provided so that the present disclosure is completely disclosed, and a person with ordinary skill in the art can fully understand the scope of the present disclosure. The present disclosure will be defined only by the scope of the appended claims. Like reference numerals indicate like constituent elements throughout the specification. In the drawings, sizes and relative sizes of layers and regions may be exaggerated for clarity of description.

The terms used in the present specification are for explaining the exemplary embodiments, not for limiting the present disclosure. Unless particularly stated otherwise in the present specification, a singular form also includes a plural form. The terms such as "comprise (include)" and/or "comprising (including)" used in the specification do not exclude presence or addition of one or more other constituent elements, steps, operations, and/or elements, in addition to the mentioned constituent elements, steps, operations, and/or elements.

Figure 2:
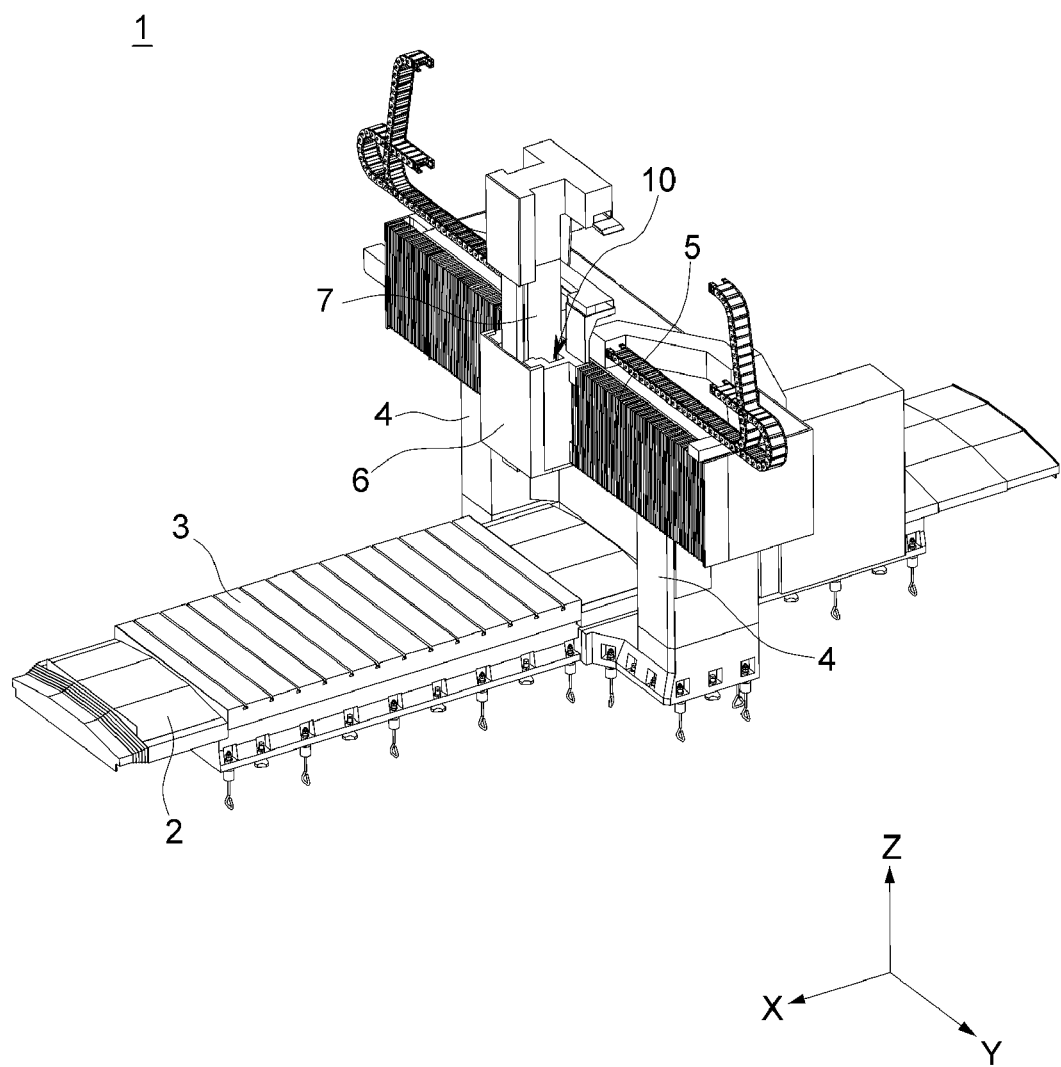
FIG. 2 is a conceptual view of a machine tool including an apparatus for cooling a ram spindle and compensating for a load according to the present disclosure.
Figure 3:
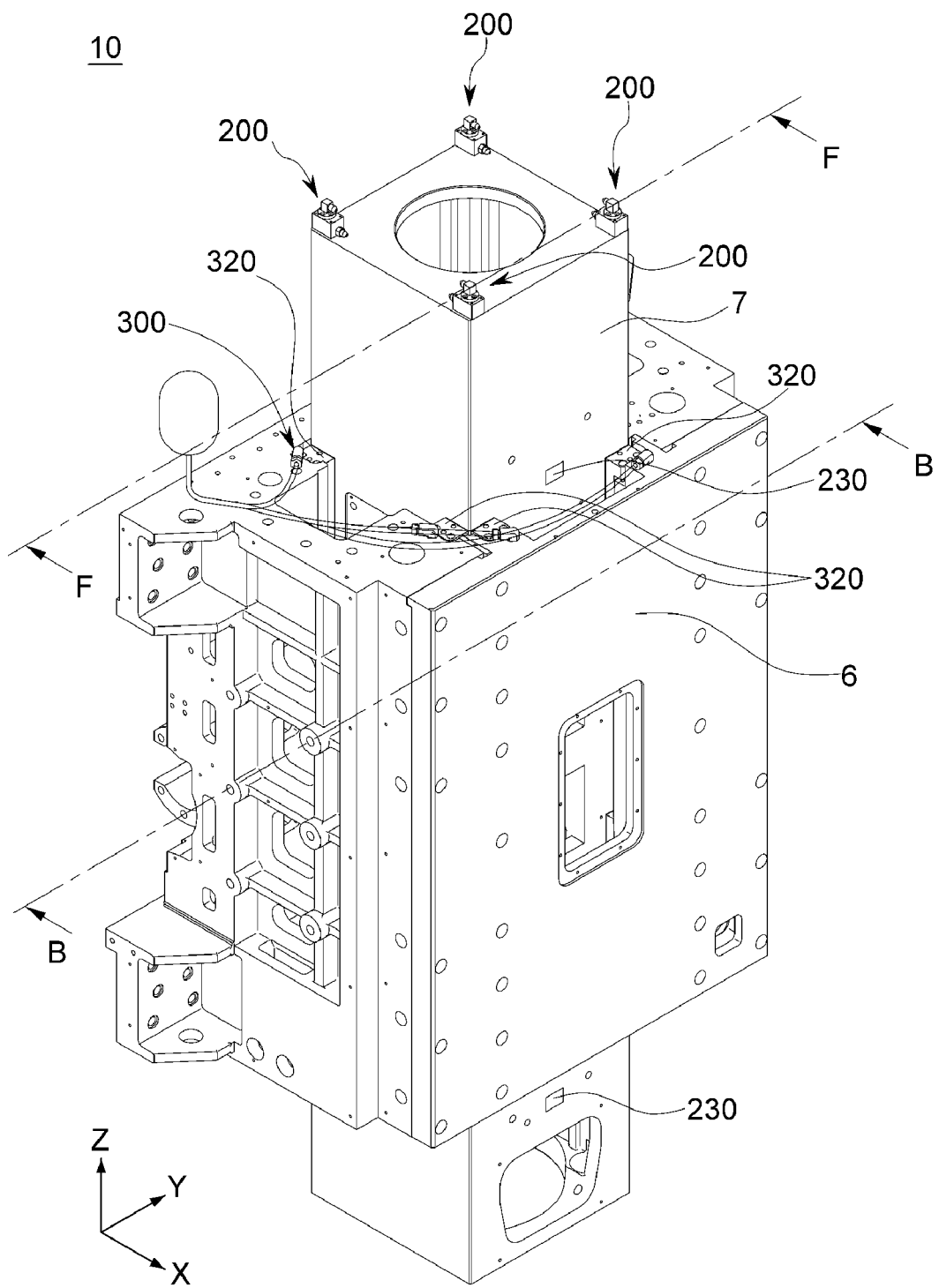
FIG. 3 is a conceptual view illustrating the apparatus for cooling the ram spindle and compensating for a load according to the present disclosure.
Figure 4:
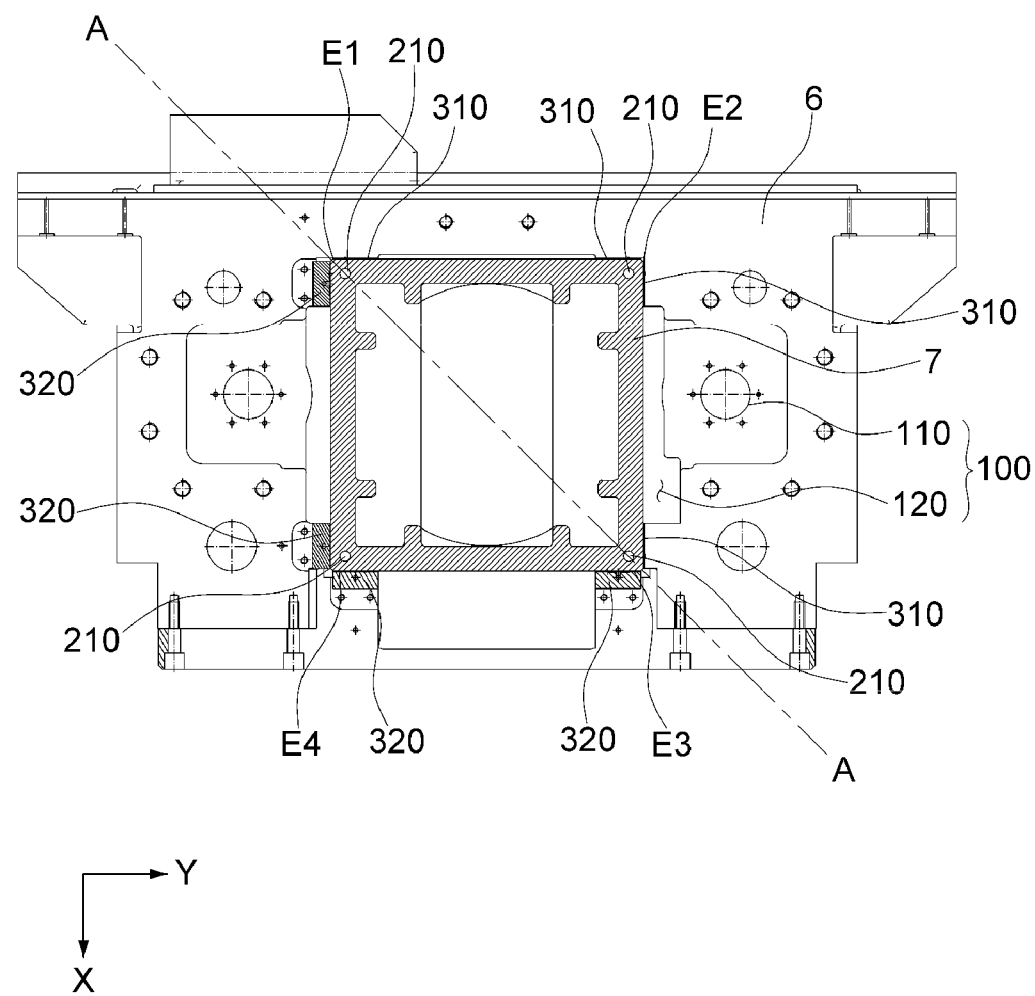
FIG. 4 is a cross-sectional view taken along line B-B in FIG. 3.
Figure 5:
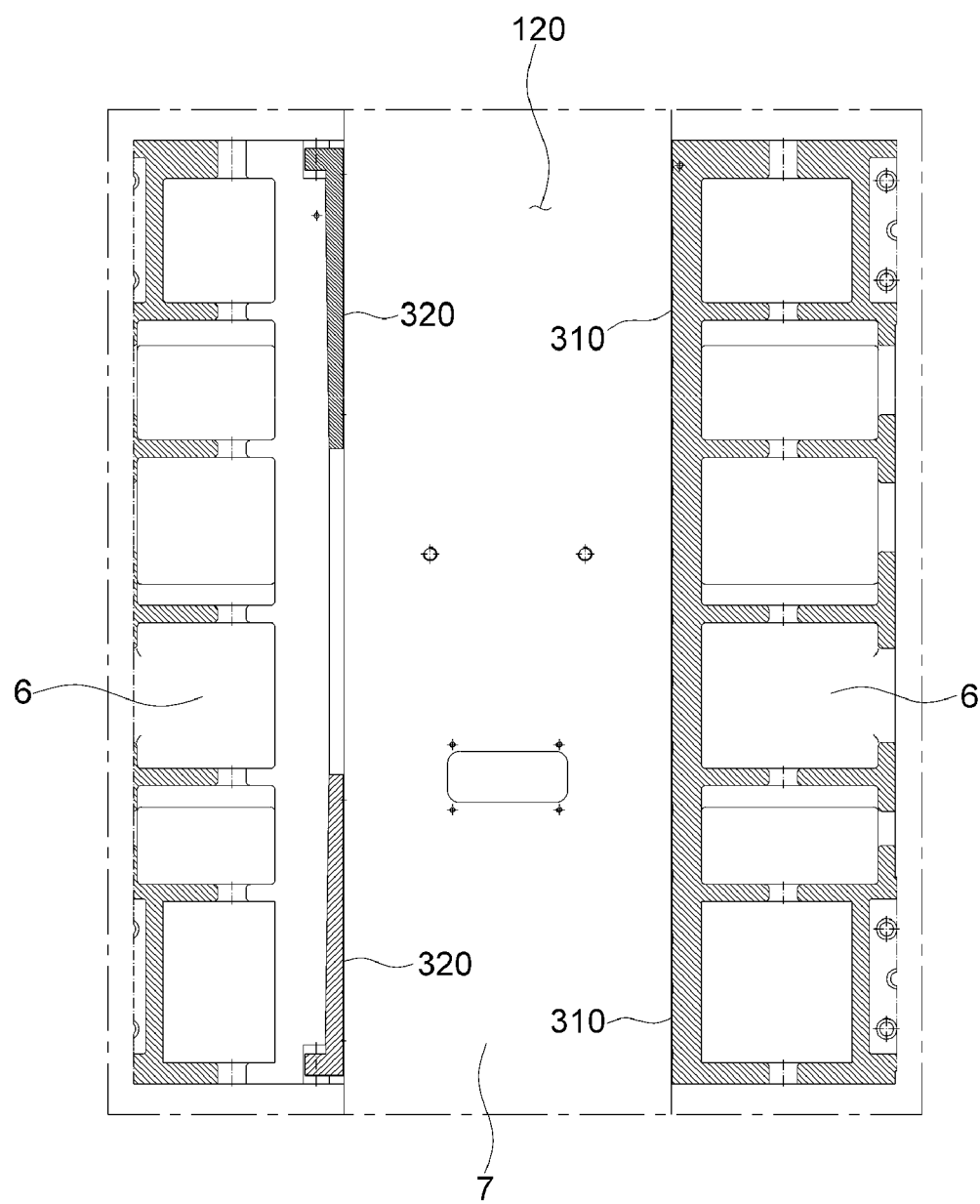
FIG. 5 is a conceptual view for explaining a state in which a gib is installed in the apparatus for cooling the ram spindle and compensating for a load according to the present disclosure.
Figure 6:
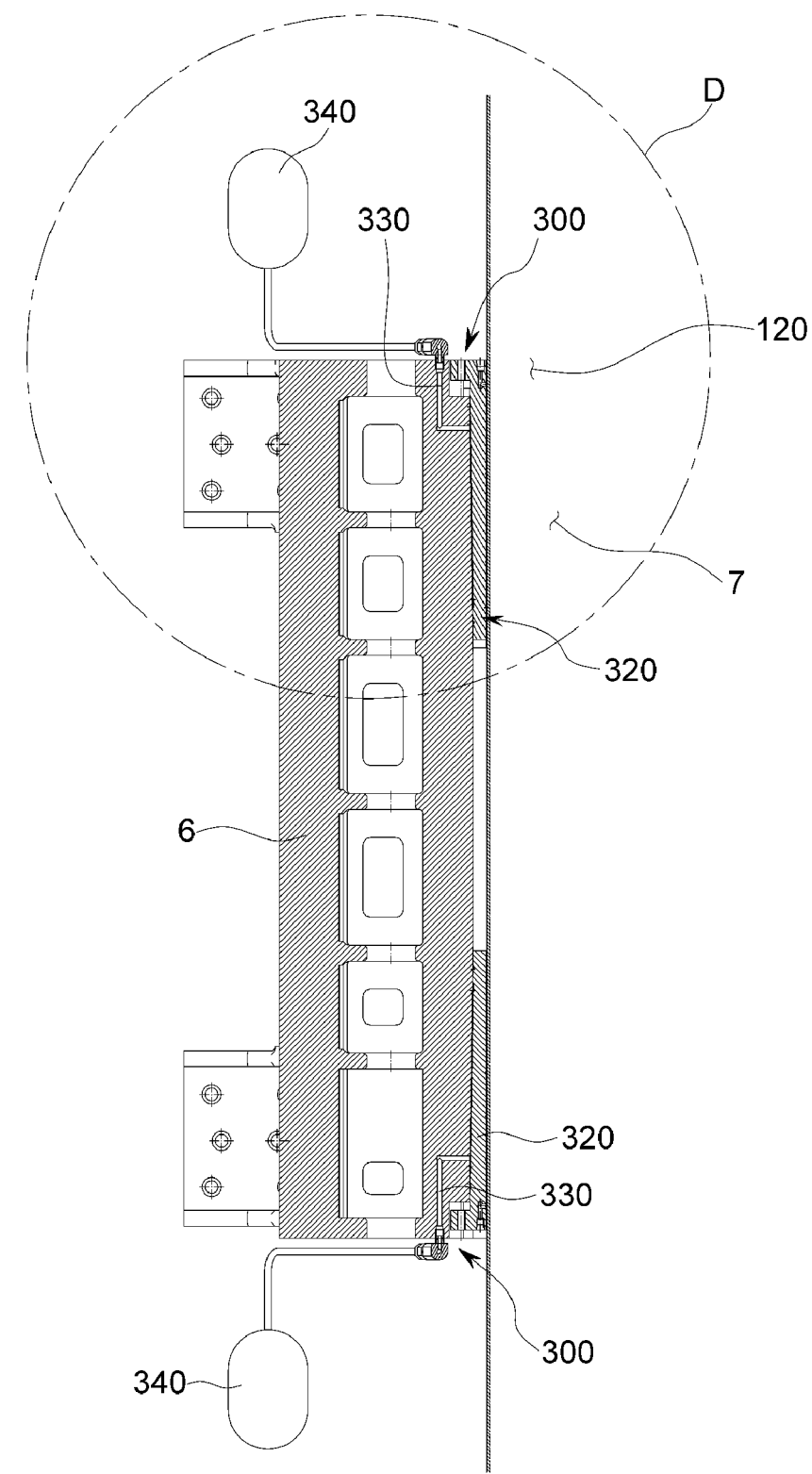
FIG. 6 is a partially cross-sectional view of FIG. 4 in a height direction.
Figure 7:
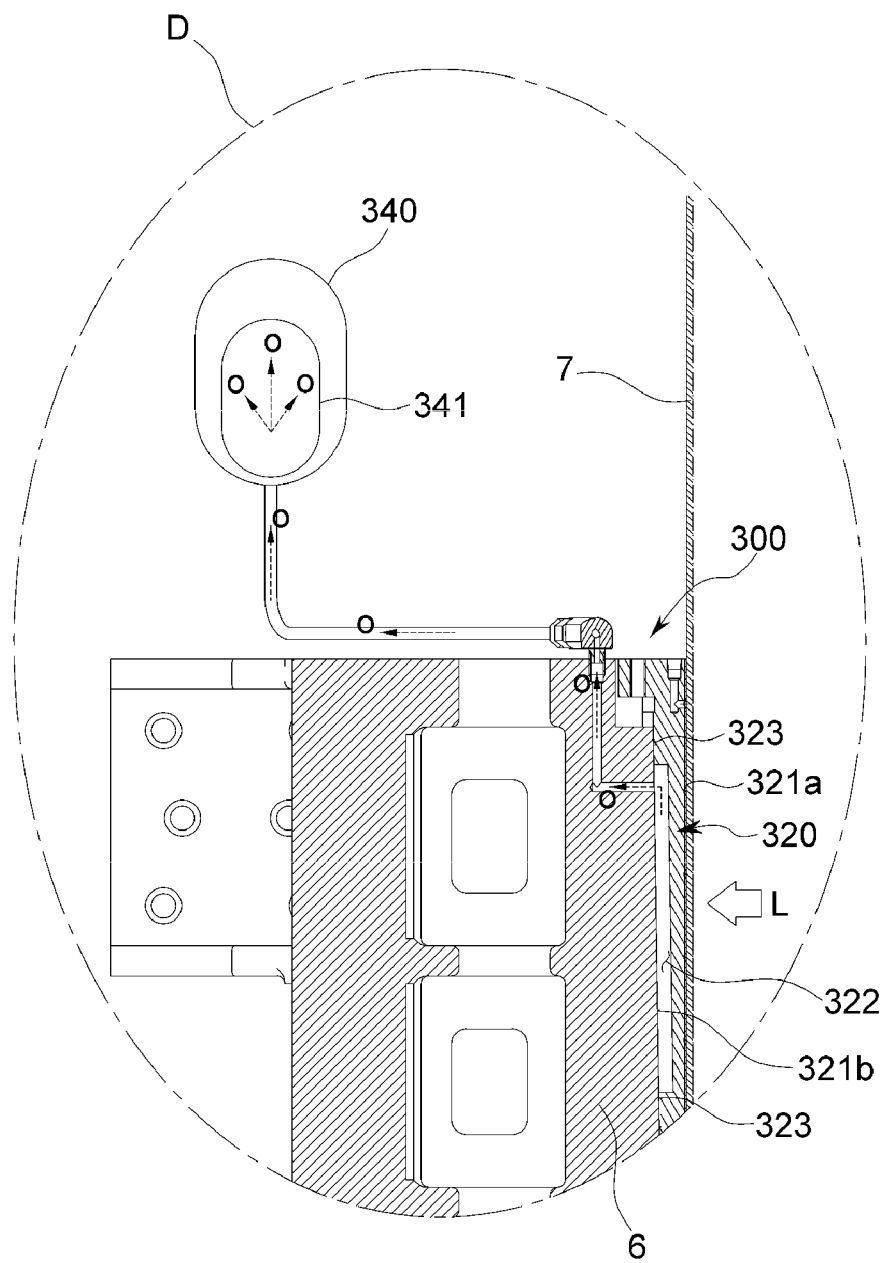
FIG. 7 is a detailed view of part D in FIG. 6.
Figure 8:
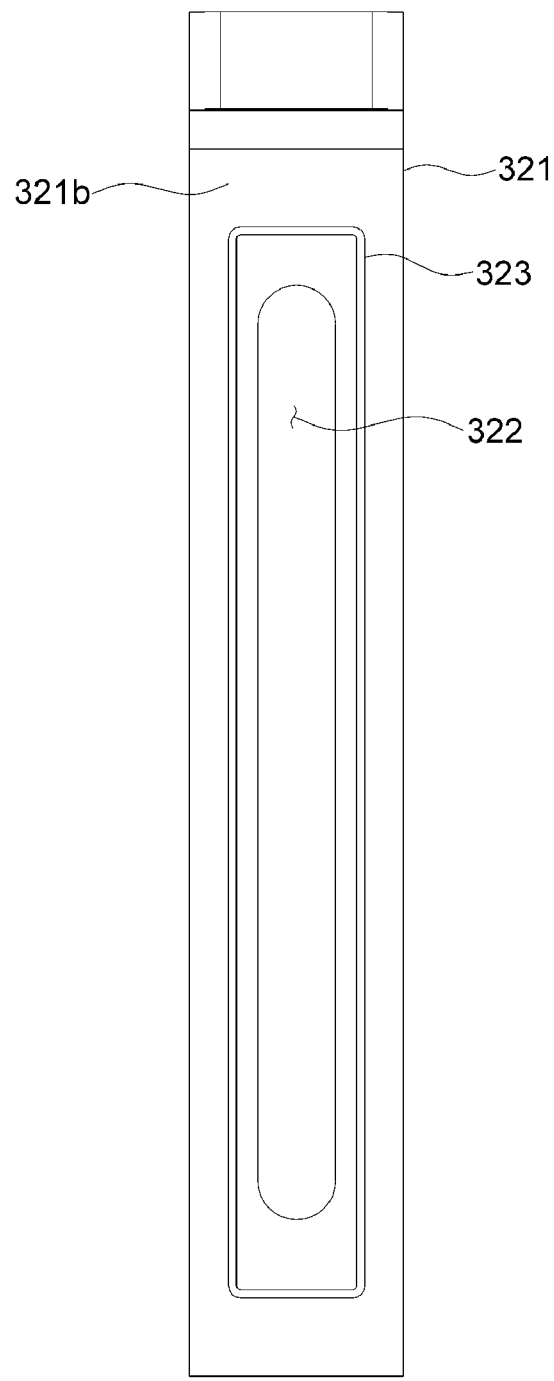
FIG. 8 is a front view of the gib of the apparatus for cooling the ram spindle and compensating for a load according to the present disclosure.
Figure 9:
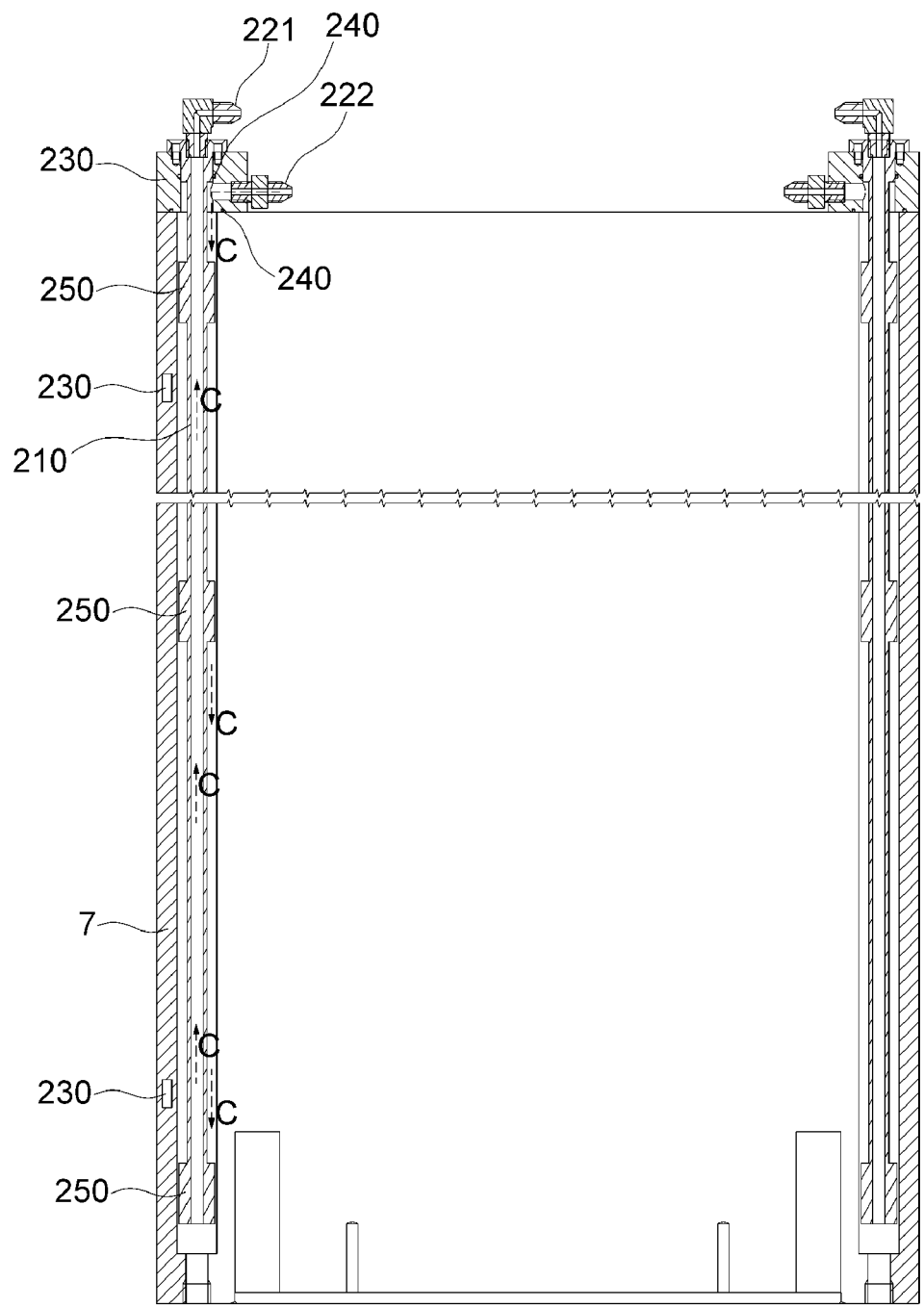
FIG. 9 is a cross-sectional view taken along line F-F in FIG. 3.

FIG. 2 is a conceptual view of a machine tool including an apparatus for cooling a ram spindle and compensating for a load according to the present disclosure, and FIG. 3 is a conceptual view illustrating the apparatus for cooling the ram spindle and compensating for a load according to the present disclosure. FIG. 4 is a cross-sectional view taken along line B-B in FIG. 3. FIG. 5 is a conceptual view for explaining a state in which a gib is installed in the apparatus for cooling the ram spindle and compensating for a load according to the present disclosure. FIG. 6 is a partially cross-sectional view of FIG. 4 in a height direction. FIG. 7 is a detailed view of part D in FIG. 6. FIG. 8 is a front view of the gib of the apparatus for cooling the ram spindle and compensating for a load according to the present disclosure. FIG. 9 is a cross-sectional view taken along line F-F in FIG. 3.

The terms used below are defined as follows. The term "horizontal direction" means a horizontal direction on the same member, i.e., a Y-axis direction in FIGS. 2 to 4, the term "vertical direction" means a vertical direction orthogonal to the horizontal direction on the same member, i.e., an X-axis direction in FIGS. 2 to 4, and the terms "height direction" means an upward/downward direction orthogonal to the horizontal direction and the vertical direction on the same member, i.e., a Z-axis direction in FIGS. 2 to 4. In addition, the term "upward (upper)" means an upward direction in the "height direction," i.e., a direction toward an upper side in the Z-axis direction in FIGS. 2 to 4, and the term "downward (lower)" means a downward direction in the "height direction," i.e., a direction toward a lower side in the Z-axis direction in FIGS. 2 to 4. In addition, the term "front surface (forward)" means a front side in the "vertical direction" on the same member, i.e., a side defined in a direction in which a saddle and a ram spindle are installed on a cross rail in FIG. 2, and the term "rear surface (rearward)" means a rear side in the "vertical direction" on the same member, i.e., a side opposite to the direction in which the cross rail is visible in FIG. 2. In addition, the term "inward (inner)" means a side relatively close to a center of the same member, i.e., an inner side of the member or component in FIGS. 2 to 9, and the term "outward (outer)" means a side relatively distant from the center of the same member, i.e., an outer side of the member or component in FIGS. 2 to 8.

An apparatus 10 for cooling a ram spindle and compensating for a load and a machine tool 1 including the same according to the present disclosure will be described with reference to FIGS. 2 to 9. As illustrated in FIG. 2, the machine tool 1 including the apparatus for cooling the ram spindle and compensating for a load according to the present disclosure includes a bed 2, a table 3, a pair of columns 4, a cross rail 5, a saddle 6, a ram spindle 7, and the apparatus 10 for cooling the ram spindle and compensating for a load.

The bed 2 is installed on the ground surface. In addition, the bed 2 may be installed on a base on a ground surface on which ground concrete work is completely performed.

The table 3 is installed on an upper portion of the bed 2 and may be transferred horizontally in the vertical direction (X-axis direction) along the bed.

The pair of columns 4 is installed at two opposite sides of the bed 4 based on the horizontal direction (Y-axis direction) while facing each other and extends in the height direction (Z-axis direction).

The cross-rail 5 is installed on the pair of columns and may be transferred upward or downward in the height direction (Z-axis direction) along the pair of columns.

The saddle 6 is installed on the cross rail and may be transferred in the horizontal direction along the cross rail. That is, the saddle is transferred leftward or rightward in the horizontal direction (Y-axis direction) along the cross rail by an operation of a driving unit.

The ram spindle 7 is installed on the saddle and may be transferred upward or downward in the height direction along the saddle. That is, the ram spindle is transferred upward or downward in the height direction along the saddle by the operation of the driving unit.

The apparatus 10 for cooling the ram spindle and compensating for a load cools the ram spindle and compensates for a load when the ram spindle is thermally expanded.

That is, the apparatus 10 for cooling the ram spindle and compensating for a load includes a transfer unit 100 configured to transfer the ram spindle relative to the saddle by means of a box guideway, a cooling unit 200 configured to cool the ram spindle, and a load compensation unit 300 configured to automatically compensate for a load applied from the ram spindle to the saddle.

A reference surface refers to a surface with which an inner part of the saddle adjacent to the driving unit and a part adjacent to an outer edge of the ram spindle are in close contact. A plurality of reference surfaces is provided. Four gibs are installed between upper and lower sides of the inner part of the saddle, which faces the reference surfaces, and the part adjacent to the outer edge of the ram spindle based on a diagonal line passing through edges of the ram spindle, which are not adjacent to one another, based on the plurality of reference surfaces.

When the ram spindle is thermally deformed, the cooling unit cools the ram spindle. In case that a load applied to the gib is changed by the thermal deformation of the ram spindle, the load is automatically compensated, such that surface pressure applied to the gib is constantly maintained.

Therefore, the machine tool including the apparatus for cooling the ram spindle and compensating for a load according to the present disclosure may reduce costs and time required to machine and maintain the workpiece, improve the productivity of the machine tool by reducing the non-machining time, reduce installation and manufacturing costs by miniaturizing the apparatus for cooling the ram spindle and compensating for a load, and make the machine tool compact.

The apparatus 10 for cooling the ram spindle and compensating for a load according to the present disclosure will be described with reference to FIGS. 3 to 9. The apparatus 10 for cooling the ram spindle and compensating for a load includes the saddle 6 installed to be movable along the cross rail, the ram spindle 7 installed to be movable along the saddle, the transfer unit 100, the cooling unit 200, and the load compensation unit 300.

The transfer unit 100 transfers the ram spindle relative to the saddle by means of the box guideway. That is, in the apparatus for cooling the ram spindle and compensating for a load and the machine tool including the same according to the present disclosure, the transfer unit may be configured as any transfer unit that transfers the ram spindle by means of a box guideway 120. As illustrated in FIG. 4, the transfer unit 100 includes a driving unit 110 configured to generate power for transferring the ram spindle.

The cooling unit 200 cools the ram spindle. As illustrated in FIGS. 4 and 9, the cooling unit 200 of the apparatus 10 for cooling the ram spindle and compensating for a load according to the present disclosure includes cooling flow paths 210, coupling parts 220, sensing parts 230, sealing parts 240, and support parts 250.

The plurality of cooling flow paths 210 may be penetratively formed in a part of the ram spindle in the height direction or installed to be inserted into a part of the ram spindle and allow a cooling fluid to flow.

In addition, the plurality of cooling flow paths is provided as four cooling flow paths disposed adjacent to the inner edge of the ram spindle adjacent to the contact friction surfaces between the ram spindle and the saddle. That is, as illustrated in FIG. 4, the four cooling flow paths are disposed inside the ram spindle so as to be adjacent to edges E1, E2, E3, and E4 of the ram spindle. The four cooling flow paths may be disposed at portions where a large amount of friction occurs between the saddle and the ram spindle when the ram spindle moves relative to the saddle by means of the box guideway, thereby minimizing the occurrence of heat caused by the movement of the ram spindle and miniaturizing the ram spindle and the saddle.

The coupling parts 220 are disposed on a part of the ram spindle so as to respectively communicate with the cooling flow paths and transmit the cooling fluid to the cooling flow paths, restore the cooling fluid from the cooling flow paths, or circulate the cooling fluid.

The sensing parts 230 are disposed on the ram spindle and sense temperatures of the ram spindle. A temperature measured by the sensing part may be transmitted to the control unit, and the control unit may adjust a flow rate and a temperature of the cooling fluid flowing through the cooling flow paths via the coupling parts, thereby preventing thermal deformation caused by the movements of the ram spindle and the saddle by means of the box guideway.

The sealing parts 240 are respectively disposed in the coupling parts and prevent a leak of the cooling fluid from the cooling flow paths. Therefore, it is possible to reduce the time and costs required to maintain the apparatus, reduce the non-machining time, and improve the productivity.

The support parts 250 are respectively disposed above and below the cooling flow paths and support the cooling flow paths. That is, in case that the cooling flow path is inserted into the ram spindle, like a pipe, instead of being formed through the ram spindle, the support part 250 serves to safely and securely support the cooling flow path provided in the form of a pipe.

In addition, as illustrated in FIG. 9, the apparatus for cooling the ram spindle and compensating for a load according to the present disclosure has a structure in which the cooling fluid is introduced toward an upper side of the ram spindle through the coupling part of the cooling unit, passes through the cooling flow path, cools the portion where heat is generated by maximum friction between the ram spindle and the saddle, and then is discharged toward the upper side along the cooling flow path. Therefore, the reduced heat is basically prevented from being transferred to the tool mounted at a lower tip of the ram spindle, which may improve cooling efficiency, minimize the deterioration in machining precision caused by thermal deformation, and improve the stability and reliability of the machine tool.

The load compensation unit 300 has gibs 320 and adjusts a load applied from the ram spindle to the saddle. As illustrated in FIGS. 6 and 7, the load compensation unit 300 of the apparatus 10 for cooling the ram spindle and compensating for a load according to the present disclosure includes hydraulic pressure flow paths 330 and compensation parts 340.

The hydraulic pressure flow path 330 is formed through a part of the saddle so that one side of the hydraulic pressure flow path 330 communicates with a pocket portion.

The compensation part 340 is installed to communicate with the other side of the hydraulic pressure flow path and serves to restore hydraulic pressure in the pocket portion or supply hydraulic pressure to the pocket portion through the hydraulic pressure flow path depending on a load applied to the gib. In addition, as illustrated in FIG. 7, the compensation part 340 includes a storage portion 341 expandably installed in the compensation part and configured to store hydraulic pressure.

As illustrated in FIGS. 5 to 8, the gib 320 of the load compensation unit 300 of the apparatus 10 for cooling the ram spindle and compensating for a load according to the present disclosure includes a main body portion 321, a pocket portion 322, and a sealing portion 323.

The main body portion 321 includes a horizontal portion 321*a* having one side formed in parallel with the height direction, and a tapered portion 321*b* having the other side tapered in the height direction and configured to come into contact with the saddle. The main body portion 321 defines an external shape of the gib, has one inclined side, and is elongated by a predetermined length in the vertical direction.

The pocket portion 322 is recessed in a part of the tapered portion and accommodates hydraulic pressure.

The sealing portion 323 prevents hydraulic pressure from leaking from the pocket portion. That is, the sealing portion is installed on a peripheral surface of the pocket portion and prevents hydraulic pressure from leaking to the outside of the pocket portion by pressurized pressure when the gib is installed between the saddle and the ram spindle.

In addition, the plurality of gibs 320 of the load compensation unit is installed inside the saddle, provided between the saddle 6 and the ram spindle 7, except for a reference surface 310 with which the ram spindle is in close contact. The plurality of gibs 320 corresponds to the reference surface 310 in the horizontal direction (Y-axis direction) or the vertical direction (X-axis direction).

In addition, the gib 320 is installed to be inserted between the inner part of the saddle, which faces the reference surface, and the part adjacent to the outer edge of the ram spindle based on a diagonal line A-A passing through edges of the ram spindle, which are not adjacent to one another, based on the plurality of reference surfaces.

In the present disclosure, the plurality of reference surfaces 310 is formed on the surface with which the inner part of the saddle 6 adjacent to the driving unit 110 and the part adjacent to the outer edge of the ram spindle 7 are in close contact. That is, as illustrated in FIG. 4, four reference surfaces 310 are formed in a '¬' shape at points E1, E2, and E3 with which the inner surface of the saddle 6 and the outer edge of the ram spindle 7 are directly in close contact based on the diagonal line A-A passing through the edge E1 and the edge E3 of the ram spindle.

Because the four reference surfaces are formed in a '¬' shape at the points E1, E2, and E3 based on the diagonal line A-A, the gibs 320 are respectively installed on the four surfaces adjacent to the '∟'-shaped saddle and the ram spindle so as to correspond to the four '¬'-shaped reference surfaces in the horizontal direction and the vertical direction based on the diagonal line A-A passing through the edge E1 and the edge E3 of the ram spindle.

Specifically, a first gib is installed to be inserted between the saddle and the ram spindle in the vertical direction at the point E1 so as to face, in the horizontal direction, the reference surface formed at the edge E2 in the vertical direction. A second gib is installed to be inserted between the saddle and the ram spindle in the vertical direction at the point E4 so as to face, in the horizontal direction, the reference surface formed at the edge E3 in the vertical direction. In addition, a third gib is installed to be inserted between the saddle and the ram spindle in the horizontal direction at the point E4 so as to face, in the vertical direction, the reference surface formed at the edge E1 in the horizontal direction. A fourth gib is installed to be inserted between the saddle and the ram spindle in the horizontal direction at the point E3 so as to face, in the vertical direction, the reference surface formed at the point E2 in the horizontal direction. As a result, the four gibs are formed in a '∟' shape and installed between the saddle and the ram spindle so as to face the four '¬'-shaped reference surfaces based on the diagonal line A-A passing through the edge E1 and the edge E3 of the ram spindle.

According to the apparatus 10 for cooling the ram spindle and compensating for a load, the cooling unit cools the ram spindle when the ram spindle is thermally deformed. In case that a load applied to the gib is changed by the thermal deformation of the ram spindle, the load compensation unit automatically compensates for the load applied to the gib, thereby automatically maintaining the surface pressure applied to the gib. That is, with the first, second, third, and fourth gibs, the cooling unit primarily cools the ram spindle in case that thermal expansion occurs when the ram spindle moves by means of the box guideway or the ram spindle itself operates. In case that the ram spindle is thermally expanded and a load applied to the gib is changed because the ram spindle is not cooled only by the cooling unit, the hydraulic pressure is adjusted to automatically adjust the surface pressure applied to the gib, such that the pressure applied to the ram spindle may be adjusted, and the machining precision may be maximized.

In addition, as illustrated in FIG. 5, the four gibs are installed between the upper and lower sides of the inner part of the saddle, which faces the reference surfaces, and the part adjacent to the outer edge of the ram spindle. That is, the four '∟'-shaped gibs are inserted between the upper and lower sides of the inner part of the saddle and the part adjacent to the outer edge of the ram spindle so as to face the '¬'-shaped reference surface based on the diagonal line A-A, and a total of eight gibs are inserted between the single saddle and the ram spindle and constantly maintain the surface pressure applied to the upper and lower sides.

Therefore, according to the apparatus for cooling the ram spindle and compensating for a load and the machine tool including the same according to the present disclosure, the cooling unit cools the friction part between the ram spindle and the saddle when the ram spindle, which is transferred by means of the box guideway, is thermally deformed. In case that a load applied to the gib is changed by thermal deformation of the ram spindle even though the cooling unit is used, a hydraulic pressure closed circuit automatically compensates for the load applied to the plurality of gibs, which is provided inside the saddle and installed between the saddle and the ram spindle, except for the reference surface with which the ram spindle is in close contact, so as to correspond to the reference surface in the horizontal direction or the vertical direction, such that the surface pressure applied to the gib is automatically and constantly maintained. Therefore, it is possible to maximize the machining precision of the machine tool, improve the stability and reliability of the machine tool, prevent damage to or breakage of the apparatus and a safety accident caused by the occurrence of a short circuit or rust by simply and quickly detecting the deterioration in machining precision caused by the thermal deformation of the ram spindle, and achieve the convenience for the operator.

An operational principle of the apparatus for cooling the ram spindle and compensating for a load and the machine tool including the same according to the present disclosure will be described with reference to FIGS. 2 to 9.

During the process of machining the workpieces, the ram spindle is continuously moved relative to the saddle by means of the box guideway, and the ram spindle is thermally expanded as the motor mounted on the ram spindle continuously operates. Therefore, as the ram spindle presses the saddle and is deformed, the position of the tool tip is changed, and vibration or the like occurs, such that the machining precision deteriorates and the apparatus or tool is damaged.

In order to prevent the problem, in case that an increase in temperature of the ram spindle is detected by the sensing part mounted on the ram spindle, the cooling fluid is supplied to the coupling part, and the fluid is supplied to the cooling flow path from the upper side of the ram spindle. The cooling fluid cools the ram spindle while flowing to the lower side of the ram spindle along the cooling flow path, flows to the upper side of the ram spindle again, and is discharged to the outside through the coupling part. The circulation of the cooling fluid primarily prevents the deterioration in machining precision caused by the thermal expansion of the ram spindle.

In case that a large amount of heat is generated or the thermal expansion of the ram spindle is increased by various external factors even though the deterioration in machining precision is primarily prevented by the cooling fluid, the ram spindle presses the saddle, as indicated by arrow L in FIG. 7. Therefore, the pressure is transmitted to the gib, and the surface pressure between the gib and the saddle is changed, such that the machining precision deteriorates.

In order to prevent the problem, as illustrated in FIG. 7, when the surface pressure is applied to the gib, as indicated by L, the hydraulic pressure accommodated in the pocket portion of the gib is transmitted to the compensation part along the hydraulic pressure flow path, and the hydraulic pressure transmitted to the compensation part is stored in the storage portion again, such that the surface pressure applied to the saddle from the gib inserted between the saddle and the ram spindle is constantly maintained.

On the contrary, in case that the surface pressure applied to the gib decreases, the hydraulic pressure stored in the storage portion of the compensation part is transmitted to the pocket portion of the gib, thereby constantly, quickly, and precisely maintaining the surface pressure between the gib and the saddle. That is, the gibs, which are installed to be inserted into the total of eight surfaces disposed adjacent to the 'L'-shaped saddle and the ram spindle and provided at the upper and lower sides so as to correspond, in the horizontal direction and the vertical direction, to the total of eight '¬'-shaped reference surfaces formed at the upper and lower sides based on the diagonal line A-A passing through the edge E1 and the edge E3 of the ram spindle, the hydraulic pressure flow path, and the hydraulic pressure closed circuit system of the compensation part may constantly maintain the surface pressure of the gib and operate complementarily with the cooling unit when the surface pressure of the gib is changed by thermal expansion and external factors. Therefore, it is possible to maximize the machining precision of the machine tool to which the box guideway is applied, reduce the machining costs by preventing a waste of resources, improve the productivity by increasing the non-machining time, and improve the stability and reliability of the machine tool.

While the present disclosure has been described above with reference to the exemplary embodiments of the present disclosure in the detailed description of the present disclosure, it may be understood, by those skilled in the art or those of ordinary skill in the art, that the present disclosure may be variously modified and changed without departing from the spirit and scope of the present disclosure disclosed in the claims. Accordingly, the technical scope of the present disclosure should not be limited to the contents disclosed in the detailed description of the specification but should be defined only by the claims.

DESCRIPTION OF MAIN REFERENCE NUMERALS OF DRAWINGS

1: Machine tool
2: Bed
3: Table
4: Pair of columns
5: Cross rail
6: Saddle
7: Ram spindle
10: Apparatus for cooling ram spindle and compensating for load
100: Transfer unit
200: Cooling unit
210: Cooling flow path
220: Coupling part
230: Sensing part
240: Sealing part
250: Support part
300: Load compensation unit
310: Reference surface
320: Gib
330: Hydraulic pressure flow path
340: Compensation part

The invention claimed is:

1. An apparatus for cooling a ram spindle and compensating for a load, the apparatus comprising:
a saddle installed to be transferred along a cross rail;
a ram spindle installed to be transferred along the saddle;
a transfer unit configured to transfer the ram spindle relative to the saddle by means of a box guideway;
a cooling unit configured to cool the ram spindle; and
a load compensation unit including gibs and configured to adjust a load applied from the ram spindle to the saddle,
wherein the gibs are provided as a plurality of gibs provided inside the saddle, disposed between the saddle and the ram spindle, except for a reference surface with which the ram spindle is in close contact, and installed to correspond to the reference surface in a horizontal direction or a vertical direction,
wherein the transfer unit comprises a driving unit configured to generate power for transferring the ram spindle, and
wherein the reference surface is provided as a plurality of reference surfaces formed on a surface with which an inner part of the saddle adjacent to the driving unit and a part adjacent to an outer edge of the ram spindle are in close contact, wherein the gibs are installed between the inner part of the saddle, which faces a respective reference surface of the plurality of reference surfaces, and the part adjacent to the outer edge of the ram spindle based on a diagonal line passing through edges of the ram spindle, which are not adjacent to one another, based on the plurality of reference surfaces.

2. The apparatus of claim 1, wherein the cooling unit cools the ram spindle when the ram spindle is thermally deformed, and wherein the load compensation unit automatically compensates for a load applied to the gib and constantly and automatically maintains surface pressure applied to the gib when the load applied to the gib is changed by the thermal deformation of the ram spindle.

3. The apparatus of claim 1, wherein the gib comprises:
a main body portion having a horizontal portion having one side formed in parallel with a height direction, and a tapered portion having the other side tapered in the height direction and configured to come into contact with the saddle;
a pocket portion recessed in a part of the tapered portion and configured to accommodate hydraulic pressure; and
a sealing portion configured to prevent hydraulic pressure from leaking from the pocket portion.

4. The apparatus of claim 3, wherein the load compensation unit comprises:
a hydraulic pressure flow path formed through a part of the saddle so that one side thereof communicates with the pocket portion; and
a compensation part installed to communicate with the other side of the hydraulic pressure flow path and configured to restore hydraulic pressure in the pocket portion or supply hydraulic pressure to the pocket portion through the hydraulic pressure flow path depending on a load applied to the gib.

5. The apparatus of claim 4, wherein the compensation part comprises a storage portion expandably installed in the compensation part and configured to store hydraulic pressure.

6. The apparatus of claim 1, wherein the gib is provided as four gibs installed between upper and lower sides of the inner part of the saddle, which faces a respective reference surface of the plurality of reference surfaces, and the part adjacent to the outer edge of the ram spindle.

7. The apparatus of claim 2, wherein the cooling unit comprises:
a plurality of cooling flow paths formed through a part of the ram spindle in a height direction or installed to be inserted into a part of the ram spindle to allow a cooling fluid to flow; and
a coupling part disposed on a part of the ram spindle so as to communicate with the cooling flow path and configured to transmit the cooling fluid to the cooling flow path, restore the cooling fluid from the cooling flow path, or circulate the cooling fluid.

8. The apparatus of claim 7, wherein the plurality of cooling flow paths is provided as four cooling flow paths disposed adjacent to an inner edge of the ram spindle adjacent to contact friction surfaces between the ram spindle and the saddle.

9. The apparatus of claim 8, wherein the cooling unit further comprises:
a sensing part disposed on the ram spindle and configured to sense a temperature of the ram spindle; and
a sealing part disposed in the coupling part and configured to prevent the cooling fluid from leaking from the cooling flow path.

10. The apparatus of claim 9, wherein the cooling unit further comprises support parts disposed at upper and lower sides of the cooling flow path and configured to support the cooling flow path.

11. A machine tool comprising an apparatus for cooling a ram spindle and compensating for a load, the machine tool comprising:
a bed;
a pair of columns installed at two opposite sides of the bed and extending in a height direction;
a cross rail installed to be transferred along the pair of columns;
a saddle installed to be transferred along the cross rail;
a ram spindle installed to be transferred along the saddle; and
an apparatus for cooling the ram spindle and compensating for a load configured to cool the ram spindle and compensate for a load when the ram spindle is thermally expanded,
wherein the apparatus for cooling a ram spindle and compensating for a load comprises:
a transfer unit having a driving unit and configured to transfer the ram spindle relative to the saddle by means of a box guideway;
a cooling unit configured to cool the ram spindle; and
a load compensation unit including a plurality of gibs provided inside the saddle, disposed between the saddle and the ram spindle, except for a reference surface with which the ram spindle is in close contact, and installed to correspond to the reference surface in a horizontal direction or a vertical direction, the load compensation unit being configured to automatically compensate for a load applied from the ram spindle to the saddle,
wherein the cooling unit cools the ram spindle when the ram spindle is thermally deformed, and
wherein when a load applied to the gib is changed by the thermal deformation of the ram spindle, the load is automatically compensated so that surface pressure applied to the gib is constantly maintained,
wherein the reference surface is provided as a plurality of reference surfaces with which an inner part of the saddle adjacent to the driving unit and a part adjacent to an outer edge of the ram spindle are in close contact, and
wherein the gibs are provided as four gibs installed between upper and lower sides of the inner part of the saddle, and an individual gib faces a respective reference surface of the plurality of reference surfaces, and the part adjacent to the outer edge of the ram spindle based on a diagonal line passing through edges of the ram spindle, which are not adjacent to one another, based on the plurality of reference surfaces.

* * * * *